United States Patent [19]

Rashid

[11] Patent Number: 5,056,123

[45] Date of Patent: Oct. 8, 1991

[54] FREQUENCY COUNTER WITH ROUND OFF FUNCTION

[75] Inventor: Abdul Rashid, Rockford, Ill.

[73] Assignee: Sundstrand Corporation, Rockford, Ill.

[21] Appl. No.: 431,375

[22] Filed: Nov. 3, 1989

[51] Int. Cl.[5] ............... G01R 23/02; G01R 23/10; G06M 3/00

[52] U.S. Cl. ............................... 377/49; 377/56; 324/78 D; 324/79 D; 328/140; 307/528

[58] Field of Search ............. 307/525, 526, 527, 528, 307/354, 234; 328/140; 324/78 D, 79 D; 377/20, 39, 49, 56

[56] References Cited

U.S. PATENT DOCUMENTS

| | | | |
|---|---|---|---|
| 3,549,997 | 12/1970 | utzel | 324/79 D |
| 3,593,166 | 7/1971 | Martin | 307/354 |
| 3,993,984 | 11/1976 | Penrod | 324/78 D |
| 4,052,676 | 10/1977 | Crittenden | 377/20 |
| 4,144,489 | 3/1979 | Ward et al. | 324/78 D |
| 4,882,740 | 11/1989 | Abe et al. | 377/49 |

*Primary Examiner*—John S. Heyman
*Attorney, Agent, or Firm*—Wood, Phillips, Mason, Recktenwald & VanSanten

[57] ABSTRACT

The frequency of the signal is determined by counting the period of the signal. A round-off circuit increments the count if the end of the signal occurs after the midpoint between counts.

5 Claims, 2 Drawing Sheets

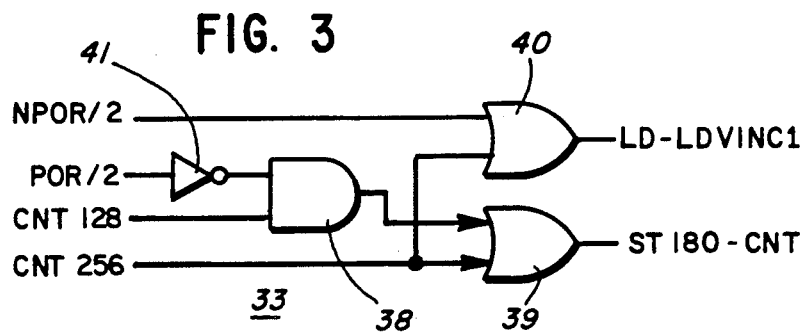
FIG. 3
FIG. 4A
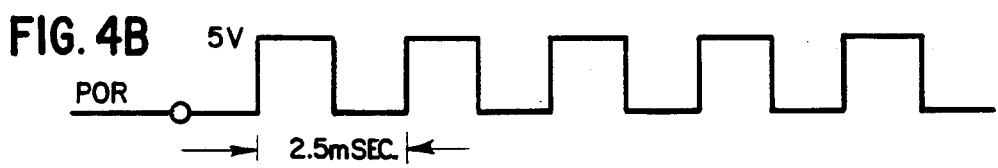
FIG. 4B
FIG. 4C
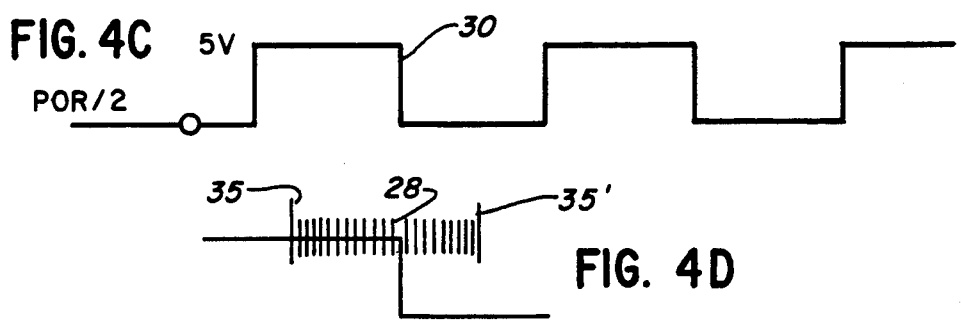
FIG. 4D
FIG. 4E
FIG. 4F

FREQUENCY COUNTER WITH ROUND OFF FUNCTION

FIELD OF THE INVENTION

This invention is concerned with a frequency counter in which the frequency of a signal is measured by counting to determine the length of the period of the signal.

BACKGROUND OF THE INVENTION

In an electrical generating system, the frequency of the generator output is sometimes measured by counting at a high rate for the period of the generator signal. When the period is not an exact multiple of the count, an error may occur, with the resulting count being lower than it should.

BRIEF SUMMARY OF THE INVENTION

This invention is concerned with a circuit for comparing the zero crossing of the generator output signal with the midpoint between counts of the counter. Means are also provided for incrementing the counter when the zero crossing of the generator output signal occurs after the midpoint between counts.

More particularly, the comparing circuit uses a logic circuit element, as an AND gate, to compare the generator output signal with a signal representing the half count of the counter to determine whether the zero crossing occurs before or after the midpoint between counts of the counter.

Further features and advantages of the invention will readily be apparent from the following specification and from the drawings, in which:

FIG. 3 is a diagram of the round off logic; and

FIG. 4 is a series of waveforms illustrating operation of the counter and round off logic.

Figure 1:
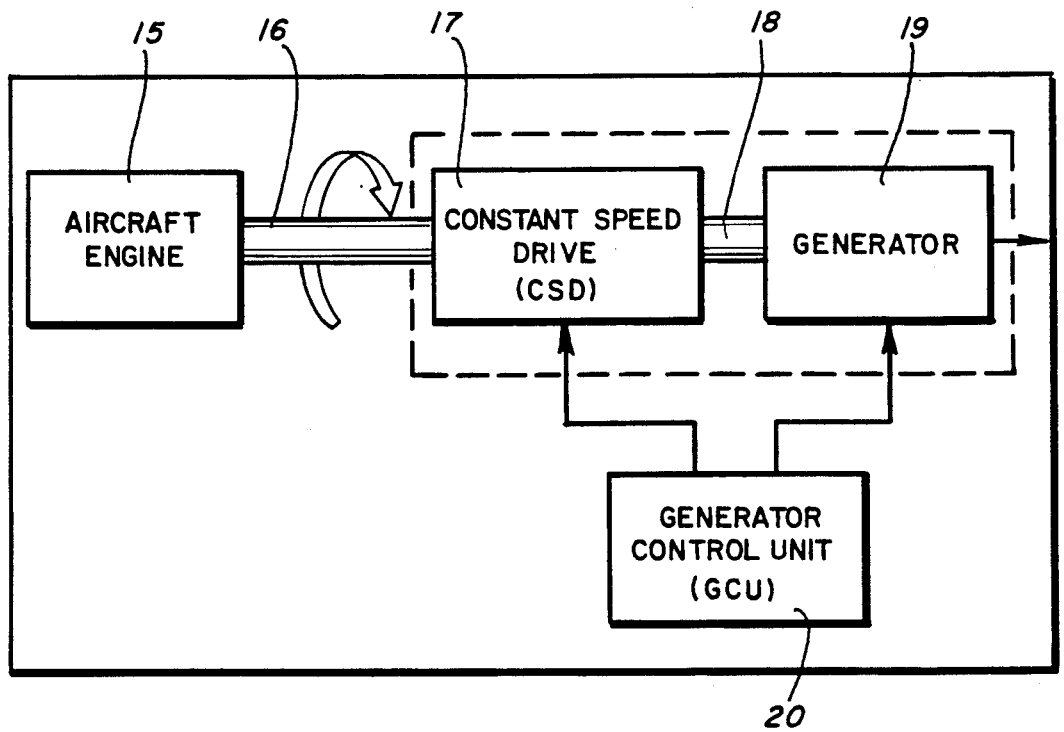
FIG. 1 is a block diagram of an electrical generating system.

A typical aircraft electric power generating system, FIG. 1, is driven by an aircraft engine 15 which will operate over a range of speeds. The output shaft 16 of the aircraft engine drives a mechanical input of constant speed drive 17 which has an output shaft 18 that drives the generator 19. The generator control unit (GCU) 20 monitors system conditions, including the speed of shaft 16 and the speed, frequency, voltage and current of generator 19. GCU 20 provides an output to a control input of constant speed drive 17 which keeps the speed of shaft 18 and thus the frequency of generator 19 within prescribed limits. Another output of GCU 20 controls generator field current to maintain the generator output voltage within limits. The frequency counter and round off logic which is the subject of this invention are a part of the GCU, used in controlling the constant speed drive to maintain constant generator frequency.

An aircraft generator has a nominal steady state frequency of 400 Hz. A generator signal from the point of regulation (POR) is digitized and connected with a zero cross filter 25. Further details of such a filter are shown in Foster et al. Ser. No. 466,653 filed Jan. 17, 1990 and assigned to the assignee of this application. The filtered signal is divided by two at block 26 so that the frequency counter is insensitive to the half period of the generator signal. Divider 26 has a POR/2 output at 200 Hz which is connected with counter 27. The counter 27 is an eight bit counter clocked at ten megahertz. The counter divides by 256 and has an output count with a period of 25.6 microseconds. A half wave of the 200 Hz POR/2 signal has a period of 2.5 milliseconds or approximately 97.7 counts of the counter 27.

The clock frequency is illustrated in FIG. 4A as a series of positive pulses 28 with a period between pulses of 0.1 microsecond. The 400 Hz POR signal, FIG. 4B, has a period of 2.5 milliseconds. The 200 Hz POR/2 signal, FIG. 4C, has a half cycle period of 2.5 milliseconds. In accordance with the invention, the falling edge 30 of the 200 Hz POR/2 signal is examined to determine whether it occurs before or after the midpoint between counts of the counter 27.

Figure 2:
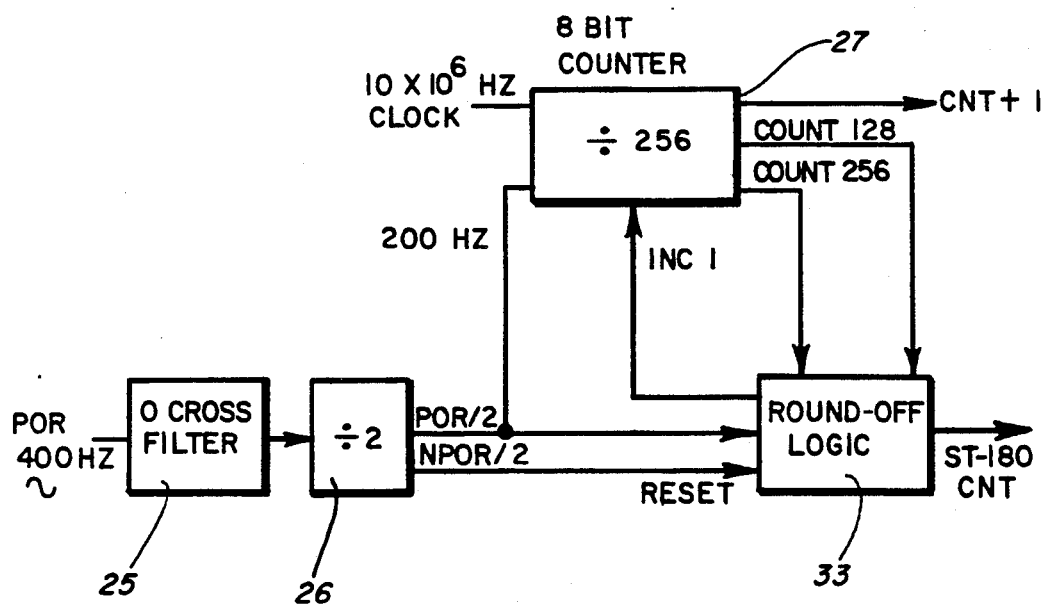
FIG. 2 is a simplified block diagram illustrating the counter and round off logic.

The round off logic block 33, FIG. 2, and FIG. 3 examines the time of occurrence of the falling edge 30 with respect to the midpoint between counts of the counter 27. The falling edge 30 of the POR/2 signal and counts of the counter 27 are shown on an expanded scale in FIG. 4D. In FIG. 4D, successive counts of the counter are indicated at 35, 35', a period of 25.6 microseconds. The short vertical lines 28 between the count lines 35, 35' represent the ten megahertz clock pulses. With the frequencies discussed, there are 255 clock pulses between the counts 35, 35' of counter 27.

The round off logic 33 includes a two input AND gate 38 and two OR gates 39, 40. The 200 Hz POR/2 signal is connected through inverter 41 with one of the inputs of the AND gate. Bit 6 of counter 27, representing a count of 128 or CNT 128 is connected with the other input of the AND gate. This signal is a square wave, FIG. 4F, with a period od of 12.8 microseconds. The inverted POR/2 signal goes positive at edge 30. If this occurs when CNT 128 is low, the output of AND gate 38 remains low. If inverted POR/2 goes positive when CNT 128 is positive, the output of AND gate 38 goes high.

The output of AND gate 38 is connected with one of the inputs of OR gate 39. The other input of OR gate 39 is count 256, bit 7, of counter 27. This signal has the form shown in FIG. 4E with positive pulses and a period of 25.6 microseconds. The output of OR gate 39, ST180-CNT indicates that the falling edge 30 of the POR/2 signal occurred before the midpoint between counts 35, 35'. This signal is coupled from the round off block 33 to further frequency measuring circuitry in the GCU.

OR gate 40 has inputs of CNT 256 and NPOR/2, an inverse of the 200 Hz POR/2 signal from divider 26. In the event falling edge 30 occurs after the midpoint of counts 35, 35', an output from OR gate 40, LD-LDVINCl, increments counter 27 providing an output CNT+1 to the further circuits of the GCU.

The round off circuit thus avoids a gross error in the count of the period of the POR signal.

What is claimed is:

1. In a control for an AC generator, the generator having an output signal with a period and frequency, the control including a generator signal frequency counter in which the generator frequency is determined by measuring the period of the generator output signal,, the control including a counter clocked at a rate greater than the generator frequency, the counter providing first count pulses which are compared with the generator signal to indicate generator frequency, a round off circuit comprising:

means in said counter providing second count pulses at twice the rate of said first count pulses, a circuit for comparing the zero crossing of the generator output signal with the second count pulses, representing the midpoint between the first count pulses of the counter.

2. The round off circuit of claim 1, further including means for incrementing the counter when the zero crossing of the generator output signal occurs after the second count pulse which represents the midpoint between the first count pulses of the counter.

3. The round off circuit of claim 1 wherein said comparing circuit is a logic circuit.

4. The round off circuit of claim 3 in which said logic circuit is a two input AND gate having the generator output signal connected with one input and the second count pulses, representing one-half count of the first count pulses of the counter connected with the other input, the output of the AND gate indicating whether the zero crossing of the generator signal occurs before or after the midpoint between the first pulses count of the counter.

5. The round off circuit of claim 4 wherein both the zero crossing of the generator output signal and the half count signal of the counter are positive going signals, and a high condition of the AND gate output indicates the occurrence of the zero crossing before the count midpoint.

* * * * *